United States Patent
Kurisu

(10) Patent No.: US 7,577,018 B2
(45) Date of Patent: Aug. 18, 2009

(54) READOUT CIRCUIT OF MAGNETIC MEMORY

(75) Inventor: Masafumi Kurisu, Tokyo (JP)

(73) Assignee: TDK Corporation, Tokyo (JP)

( * ) Notice: Subject to any disclaimer, the term of this patent is extended or adjusted under 35 U.S.C. 154(b) by 124 days.

(21) Appl. No.: 11/713,363

(22) Filed: Mar. 5, 2007

(65) Prior Publication Data

US 2007/0211524 A1 Sep. 13, 2007

(30) Foreign Application Priority Data

Mar. 7, 2006 (JP) ............................ P2006-061363
Mar. 7, 2006 (JP) ............................ P2006-061366

(51) Int. Cl.
*G11C 11/00* (2006.01)
(52) U.S. Cl. ...................... 365/158; 365/171; 365/148; 365/189.011; 365/189.07; 977/933
(58) Field of Classification Search ................. 365/158, 365/171, 173, 189.011, 189.07, 148; 257/421, 257/E21.665; 438/3; 977/934, 935
See application file for complete search history.

(56) References Cited

U.S. PATENT DOCUMENTS

| | | | |
|---|---|---|---|
| 2004/0083328 A1* | 4/2004 | Gogl et al. | 711/1 |
| 2004/0100855 A1* | 5/2004 | Saito et al. | 365/232 |
| 2004/0130936 A1* | 7/2004 | Nguyen et al. | 365/158 |
| 2004/0160811 A1* | 8/2004 | Tsuchida | 365/158 |

FOREIGN PATENT DOCUMENTS

| | | |
|---|---|---|
| JP | A 2001-266567 | 9/2001 |
| JP | A 2001-325791 | 11/2001 |
| JP | A 2002-533863 | 10/2002 |
| WO | WO 00/38192 A1 | 6/2000 |

OTHER PUBLICATIONS

Feasibility of Ultra-Dense Spin-Tunneling Random Access Memory, Wang et al., IEEE Transactions on Magnetics, vol. 33, No. 6, Nov. 1997.*
Spintronics—A Retrospective and Perspective, Wolf et al., IBM Journal of Research and Development, vol. 50, No. 1, Jan. 2006.*

* cited by examiner

*Primary Examiner*—Son Dinh
*Assistant Examiner*—Harry W Byrne
(74) *Attorney, Agent, or Firm*—Oliff & Berridge, PLC

(57) ABSTRACT

In an example, a determination circuit 5 determines whether an input waveform is a first waveform (=0) or a second waveform (=1). When magnetization switching is caused during writing, the second waveform (=1) having a large voltage change is outputted, and thus the determination circuit 5 determines that the output waveform is the second waveform, using threshold determination or the like. In another example, when an initial voltage V1 agrees with a voltage V2 stored by intentionally writing "0", "0" is outputted; when V1 disagrees with V2, "1" is outputted. In the disagreement case, the written data is rewritten into the original data "1."

11 Claims, 11 Drawing Sheets

READOUT CIRCUIT OF MAGNETIC MEMORY

BACKGROUND OF THE INVENTION

1. Field of the Invention

The present invention relates to a readout circuit of a magnetic memory.

2. Related Background Art

An MRAM (Magnetic Random Access Memory) has a structure in which a TMR (Tunnel Magnetoresistance) element is located at each of intersections between bit lines and word lines routed in a lattice-shaped pattern. An ordinary TMR element is comprised of a three-layer structure of ferromagnetic layer/nonmagnetic insulating layer/ferromagnetic layer having a nonmagnetic layer between two ferromagnetic layers. The ferromagnetic layers are normally made of a magnetic element of a transition metal (Fe, Co, or Ni) or an alloy of magnetic elements of transition metals (CoFe, CoFeNi, NiFe, or the like) in the thickness of not more than 10 nm, and the nonmagnetic insulating layer is made of $Al_2O_3$, MgO, or the like.

One ferromagnetic layer (fixed layer) forming the TMR element is a layer in which an orientation of magnetization is fixed, and the other ferromagnetic layer (magnetosensitive layer or free layer) is a layer in which an orientation of magnetization rotates according to an external magnetic field. A popularly used structure for the fixed layer is an exchange coupling type in which one ferromagnetic layer is given an antiferromagnetic layer (FeMn, IrMn, PtMn, No, or the like).

Memory information "1" or "0" is defined according to a state of orientations of magnetizations in the two ferromagnets forming the TMR element, i.e., depending upon whether the directions of magnetizations are parallel or antiparallel. When the orientations of magnetizations in these two ferromagnets are antiparallel, the value of electric resistance in the thickness direction is larger than when the orientations of magnetizations are parallel.

Therefore, the information "1" or "0" is read out by applying an electric current in the thickness direction of the TMR element and measuring a resistance value or a voltage value of the TMR element by the MR (magnetoresistance) effect.

A conventionally proposed method for writing the information "1" or "0" is to rotate the orientation of magnetization in the magnetosensitive layer of the TMR element by action of a magnetic field established when an electric current is applied to wires located near the TMR element, and in recent years, a writing method by spin injection is also becoming popular.

Patent Document 1 (Published Japanese Translation of PCT Application No. 2002-533863) discloses the readout circuit of the magnetic memory having a plurality of magnetic memory cells arranged on intersecting points between bit lines and word lines, and describes that a magnetoresistance of a target cell is compared with a magnetoresistance of a reference cell to enable output of the result.

Patent Document 2 (Japanese Patent Application Laid-Open No. 2001-266567) describes the readout circuit of the magnetic memory which utilizes one switch (transistor and diode) and two tunnel junctions to realize a differential method and realize excellent S/N ratios.

Patent Document 3 (Japanese Patent Application Laid-Open No. 2001-325791) describes the readout circuit of the magnetic memory in which potentials given to the word lines are kept equal, so as to prevent inflow of an electric current from an unintended path.

In the above-described conventional technologies, the information "0" or "1" upon readout is determined by comparing a detected value from each magnetoresistive element with a reference value.

SUMMARY OF THE INVENTION

However, characteristics of the magnetoresistive elements slightly differ among the elements, and thus accurate readout is sometimes infeasible. The present invention has been accomplished in view of this problem and an object of the invention is to provide a readout circuit of a magnetic memory capable of accurate readout of information.

In order to solve the above problem, a readout circuit of a magnetic memory according to the first aspect of the invention is a readout circuit of a magnetic memory consisting of an array of magnetoresistive elements each having a magnetosensitive layer capable of spin-injection magnetization switching, the readout circuit comprising: data writing means for writing first data in the magnetoresistive element; and determining means for determining whether an output waveform from the magnetoresistive element upon writing of the first data by the data writing means is a first waveform outputted when the first data has previously been written in the magnetoresistive element, or a second-waveform outputted when second data different from the first data has previously been written in the magnetoresistive element; wherein when the determining means determines that the output waveform is the second waveform, the data writing means induces spin-injection magnetization switching in the magnetosensitive layer to write the second data in the magnetoresistive element.

When a spin to switch the orientation of magnetization written previously is injected into the magnetosensitive layer of the magnetoresistive element, the magnetosensitive layer causes a larger voltage change between two ends than in a case where a spin not to switch it is injected. Namely, a larger energy is dissipated for magnetization switching on the occasion of spin-injection magnetization switching.

When the value preliminarily stored in the magnetosensitive layer of the magnetoresistive element is the writing data (first data="0" for example), the output change is small upon writing of the first data and the first waveform is outputted. A logic to indicate the first waveform is defined as "0." When the value preliminarily stored in the magnetosensitive layer of the magnetoresistive element is the second data (e.g., "1") different from the writing data, the output change is large upon writing of the first data and the second waveform is outputted. A logic to indicate the second waveform is defined as "1."

More specifically, when the data writing means writes the first data "0," the output waveform from the magnetoresistive element differs according to the orientation of magnetization in the magnetosensitive layer. When the first data "0" has previously been written in the magnetoresistive element, the output waveform from the magnetoresistive element upon the writing is the first waveform. When the second data "1" has previously been written in the magnetoresistive element, the output waveform is the second waveform. The determining means determines whether the input waveform is the first waveform (=0) or the second waveform (=1). When magnetization switching is induced upon writing, the second waveform (=1) with large voltage change is outputted, and thus the determining means determines that the output waveform is the second waveform, using threshold determination or the like.

When the read data is the first data "0," there is no change in the orientation of magnetization in the magnetosensitive layer between before and after the writing, and thus there is no need for special processing. However, when the read data is the second data "1," the orientation of magnetization in the magnetosensitive layer is changed from "1" to "0" between before and after the writing, and thus the data is rewritten into the second data (=1) stored before the readout. Namely, since the data writing means has written "0" in spite of the stored data being "1," the data writing means rewrites the data in the magnetosensitive layer to the original data "1."

Since the foregoing readout circuit performs the determination on the basis of the output waveform upon rewriting of stored data of its own, it achieves accurate data readout from each element even if the characteristics of the magnetoresistive elements slightly differ among the elements. Since the stored data is read out while being broken by writing, even if the write current upon readout (readout current) is set so large as to cause magnetization switching, there is no effect on the determination of read data and it is thus feasible to lift restrictions on the magnitude of the readout current.

The readout circuit is characterized in that the determining means comprises a comparator two input terminals of which are connected to the magnetoresistive element and a reference potential, respectively. Namely, when the output from the magnetoresistive element is not more than the reference potential, an output from the comparator is L-level, e.g., "0" is outputted, whereby it can be determined that the first waveform is outputted. When the output from the magnetoresistive element exceeds the reference potential, an output from the comparator is H-level, e.g., "1" is outputted, whereby it can be determined that the second waveform is outputted.

The readout circuit is characterized in that the data writing means is arranged as follows: in writing of the first data, the data writing means applies a write current flowing in a first direction, to the magnetoresistive element; in writing of the second data, the data writing means applies a write current flowing in a direction opposite to the first direction, to the magnetoresistive element.

In the data writing making use of the spin-injection magnetization switching, a state of stored data can be varied by switching the direction of flow of the electric current. For example, when a write current is allowed to flow in the first direction, "0" is written; when a write current is allowed to flow in the opposite direction, "1" is written.

The readout circuit of the magnetic memory according to the present invention is characterized by further comprising input/output means for outputting a result of determination by the determining means, by a logical level as readout information to the outside.

Namely, the result of the determination by the determining means corresponds to the data stored in the magnetoresistive element. When "0" is preliminarily stored, the determination result is the first waveform and the logical level corresponding to the first waveform is defined as "L" (=0), whereby "0" is read out. When "1" is preliminarily stored, the determination result is the second waveform and the logical level corresponding to the second waveform is defined as "H" (=1), whereby "1" is read out. This logical level is outputted to the outside by the input/output means.

In the case of the conventional readout circuits, since the characteristics of the magnetoresistive elements slightly differ among the elements, the use of the comparison with the constant reference value can lead to failure in accurate readout with a large difference in the element characteristics.

The second object of the present invention is to provide a readout circuit of a magnetic memory capable of accurate readout of information in such cases.

In order to solve the above problem, a readout circuit of a magnetic memory according to the present invention is a readout circuit of a magnetic memory consisting of an array of magnetoresistive elements each having a magnetosensitive layer capable of spin-injection magnetization switching, the readout circuit comprising: first storing means for temporarily storing a first output value of the magnetoresistive element in a first period; second storing means for temporarily storing a second output value of the magnetoresistive element in a second period after the first period; determining means for making a determination on agreement between the first and second output values stored in the first and second storing means; and data writing means for writing first data in the magnetoresistive element at a time between the first and second periods and for, when a result of the determination by the determining means indicates disagreement after the second period, inducing spin-injection magnetization switching in the magnetosensitive layer to write second data different from the first data in the magnetoresistive element.

In the readout circuit of the present invention, the first storing means stores the value preliminarily stored in the magnetoresistive element, as the first output value, the data writing means intentionally writes the first data in the magnetoresistive element, and this value is again stored as the second output value in the second storing means. When the preliminarily stored value agrees with the writing data (first data="0" for example), the first and second output values stored are equal to each other, and thus the result of the determination by the determining means is the first data "0" (agreement). Namely, the stored data is found to be "0."

On the other hand, when the preliminarily stored value does not agree with the writing data (first data="0" for example), the first and second output values stored do not agree with each other, and thus the result of the determination by the determining means is the second data "1" (disagreement). Namely, the stored data is found to be data different from "0," i.e., "1." Since the data writing means has written "0," the data writing means rewrites this data to the original data "1." Since this readout circuit performs the determination on the basis of the stored data of its own, it achieves accurate data readout from each element even if the characteristics of the magnetoresistive elements slightly differ among the elements.

Such data writing can be implemented by the spin-injection magnetization switching in the magnetosensitive layer.

Preferably, the determining means comprises: difference means for outputting a difference between the first and second output values; and a comparison circuit for outputting a signal indicating agreement, when an output result from the difference means is not more than a preset value.

It is noted that the aforementioned "agreement" does not have to be perfect agreement and that the agreement allows for some error. Preferably, the error is not more than 10%. In this case, a determination of "agreement" can be made when the difference between the first and second output values is not more than the preset value.

The readout circuit is characterized in that the data writing means is arranged as follows: in writing of the first data, the data writing means applies a write current flowing in a first direction, to the magnetoresistive element; in writing of the second data, the data writing means applies a write current flowing in a direction opposite to the first direction, to the magnetoresistive element.

In the data writing making use of the spin-injection magnetization switching, a state of stored data can be varied by switching the direction of flow of the electric current. For example, when a write current is allowed to flow in the first direction, "0" is written; when a write current is allowed to flow in the opposite direction, "1" is written.

The readout circuit of the magnetic memory according to the present invention is characterized by further comprising input/output means for outputting a result of the determination by the determining means, by a logical level as readout information to the outside.

Namely, the result of the determination by the determining means corresponds to the data stored in the magnetoresistive element. When "0" is preliminarily stored, the determination result is set to "agreement" and the logical level for "agreement" is defined "L" (=0), whereby "0" is read out. When "1" is preliminarily stored, the determination result is set to "disagreement" and the logical level for "disagreement" is defined as "H" (=1), whereby "1" is read out. This logical level is outputted to the outside by the input/output means.

The readout circuit of the magnetic memory according to the present invention achieves accurate readout of information.

DESCRIPTION OF THE PREFERRED EMBODIMENTS

Readout circuits of magnetic memory according to embodiments will be described below. The same elements will be denoted by the same reference symbols, without redundant description.

Figure 1:
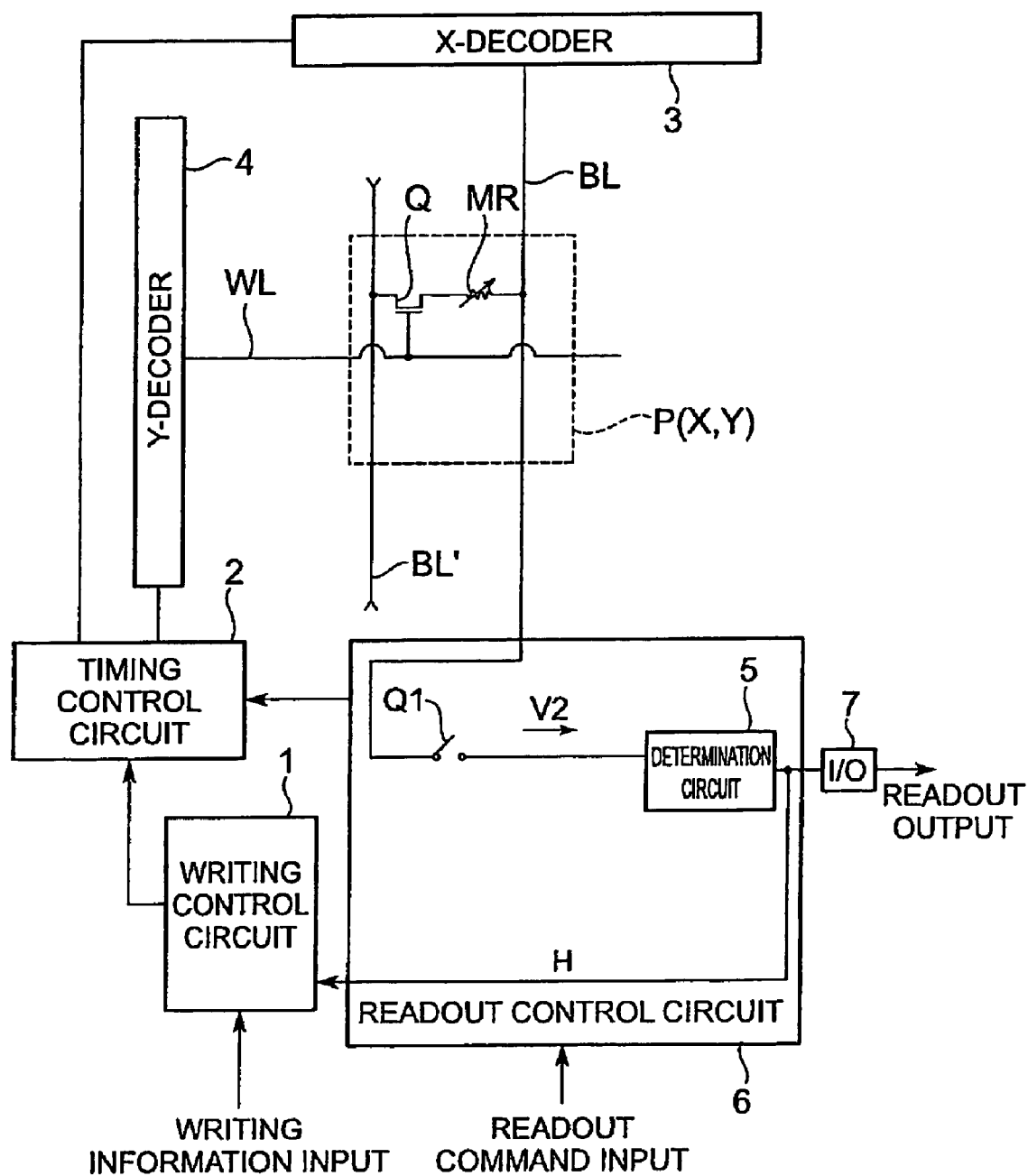
FIG. 1 is a block diagram of a magnetic memory having a readout circuit.

FIG. 1 is a block diagram of a magnetic memory having a readout circuit according to the first embodiment. A storage section of the magnetic memory consists of an array of storage regions P(X,Y) in X columns and Y rows, and each storage region P(X,Y) has a magnetoresistive element MR.

One magnetoresistive element MR has a magnetosensitive layer capable of spin-injection magnetization switching, in which magnetization switching is induced according to a direction and magnitude of an injected electric current, so as to cause a change in resistance.

Each of bit lines extending along the Y-axis from X-decoder 3 is connected to one ends of the magnetoresistive elements MR, and the other ends of the magnetoresistive elements MR are connected through a transistor Q for switching to a reference line BL'. A gate of each transistor Q is connected to a word line WL extending along the X-axis from Y-decoder 4.

When writing information indicating an address of a storage region P(X,Y) and writing data is fed to writing control circuit (data writing means) 1, the writing control circuit 1 drives timing control circuit 2 to control the X-decoder 3 and Y-decoder 4 as described below, so as to write the data in the storage region P(X,Y).

In a state in which a potential of a bit line BL is kept higher than a potential of the reference line BL' (i.e., in a state of the potential of the bit line BL=$V_H'$), a potential of the word line WL is set to a specific level and the transistor for switching Q is turned on, whereupon a write current $I_W$ flows from the bit line BL into the magnetoresistive element MR to inject a spin of a specific polarity into the magnetosensitive layer, thereby writing "0," for example. In a state in which the potential of the bit line BL is kept lower than the reference potential (i.e., in a state of the potential of the bit line BL=$V_L'$), the potential of the word line WL is set to a specific level and the transistor for switching Q is turned on, whereupon a write current $I_W$ flows from the reference line BL' into the magnetoresistive element MR, to inject a spin of the polarity opposite to that in the above, thereby writing "1," for example. During the writing, the potential of the reference line BL' is set, for example, at an arbitrary constant value $V_M$.

As described above, the writing circuit 1 applies the write current $I_W$ flowing in the first direction to the magnetoresistive element MR in writing of the first data (=0) and applies the write current $I_W$ flowing in the direction opposite to the first direction in writing of the second data (=1). In the data writing malting use of the spin-injection magnetization switching, the state of data stored can be varied by switching the direction of flow of the electric current. In the present example, "0" is written by flow of the write current $I_W$ in the first direction, and "1" by flow of the write current $I_W$ in the opposite direction.

When a readout command indicating an address of storage region P(X,Y) is fed to the readout control circuit 6, the readout control circuit 6 drives the timing control circuit 2 to control the X-decoder 3 and Y-decoder 4 as described below, so as to read out the data in the storage region P(X,Y).

First, in a connected state of switch Q1, a potential of an internal resistor of the decoder 3 connected to the bit line BL is set higher than the potential of the reference line BL' (i.e., the potential of the internal resistor=$V_H'$), the potential of the word line WL is set to a specific level, and the transistor for switching Q is turned on, whereupon a write current (=read current) $I_W$ flows from the bit line BL into the magnetoresistive element MR through the internal resistor of the decoder 3, to inject a spin of a specific polarity into the magnetosensitive layer, thereby writing "0," for example. Injected electrons flow in the direction opposite to that of the electric current. The writing control circuit 1 writes the first data (=0) into the magnetoresistive element MR. A potential V2 of the bit line BL at this time is fed to determination circuit 5, and the determination circuit 5 performs a threshold determination to determine whether the potential V2 is not more than a reference potential (=L), or exceeds the reference potential (=H).

More specifically, the determination circuit 5 determines by the threshold determination, whether an output waveform from the magnetoresistive element MR upon writing of the first data (=0) by the writing control circuit 1 is a first waveform (L=0) outputted when the first data (=0) has previously been written in the magnetoresistive element MR, or the second waveform (H=1) outputted when the second data (=1)

different from the first data (=0) has previously been written in the magnetoresistive element MR.

When a spin to switch the orientation of magnetization written previously is injected into the magnetosensitive layer of the magnetoresistive element MR, the magnetosensitive layer causes a larger voltage change between two ends than when a spin not to switch it is injected. Namely, a larger energy is dissipated for magnetization switching during the spin-injection magnetization switching.

When the value preliminarily stored in the magnetosensitive layer of the magnetoresistive element MR is the writing data (first data="0" for example), the output change is small in writing of the first data and the first waveform is outputted. A logic to indicate the first waveform is defined as L="0." When the value preliminarily stored in the magnetosensitive layer of the magnetoresistive element MR is second data (e.g., "1") different from the writing data, the output change is large in writing of the first data and the second waveform is outputted. A logic to indicate the second waveform is defined as H="1."

When the writing control circuit 1 writes the first data "0," the output waveform from the magnetoresistive element MR differs according to the orientation of magnetization in the magnetosensitive layer. When the first data "0" has previously been written in the magnetoresistive element MR, the output waveform from the magnetoresistive element MR in the writing is the first waveform; when the second data "1" has previously been written in the magnetoresistive element, the output waveform is the second waveform.

The determination circuit 5 determines whether the input waveform is the first waveform (=0) or the second waveform (=1). When the magnetization switching is induced during the writing, the second waveform (=1) with the large voltage change is outputted and thus the determination circuit 5 determines that the output waveform is the second waveform, using the threshold determination or the like.

When the read data is the first data "0," there is no change in the orientation of magnetization in the magnetosensitive layer between before and after the writing, and thus there is no need for special processing. However, when the read data is the second data "1," the orientation of magnetization in the magnetosensitive layer is, changed from "1" to "0" between before and after the writing, and the data is rewritten into the second data (=1) stored before the readout. Namely, since the data writing means has written "0," in spite of the stored data being "1," the data writing means rewrites the data in the magnetosensitive layer into the original data "1." When the determination circuit 5 determines that the output waveform is the second waveform, the writing control circuit 1 induces the spin-injection magnetization switching in the magnetosensitive layer to write the second data "1" in the magnetoresistive element MR.

This readout circuit is provided with an input/output circuit (input/output means) 7 for outputting the result of the determination by the determination circuit 5, by a logical level as readout information to the outside. The result of the determination by the determination circuit 5 corresponds to the data stored in the magnetoresistive element MR. When "0" is preliminarily stored, the determination result is the first waveform and the logical level corresponding to the first-waveform is defined as "L" (=0), whereby "0" is read out. When "1" is preliminarily stored, the determination result is the second waveform and the logical level corresponding to the second waveform is defined as "H" (=1), whereby "1" is read out.

Figure 2:
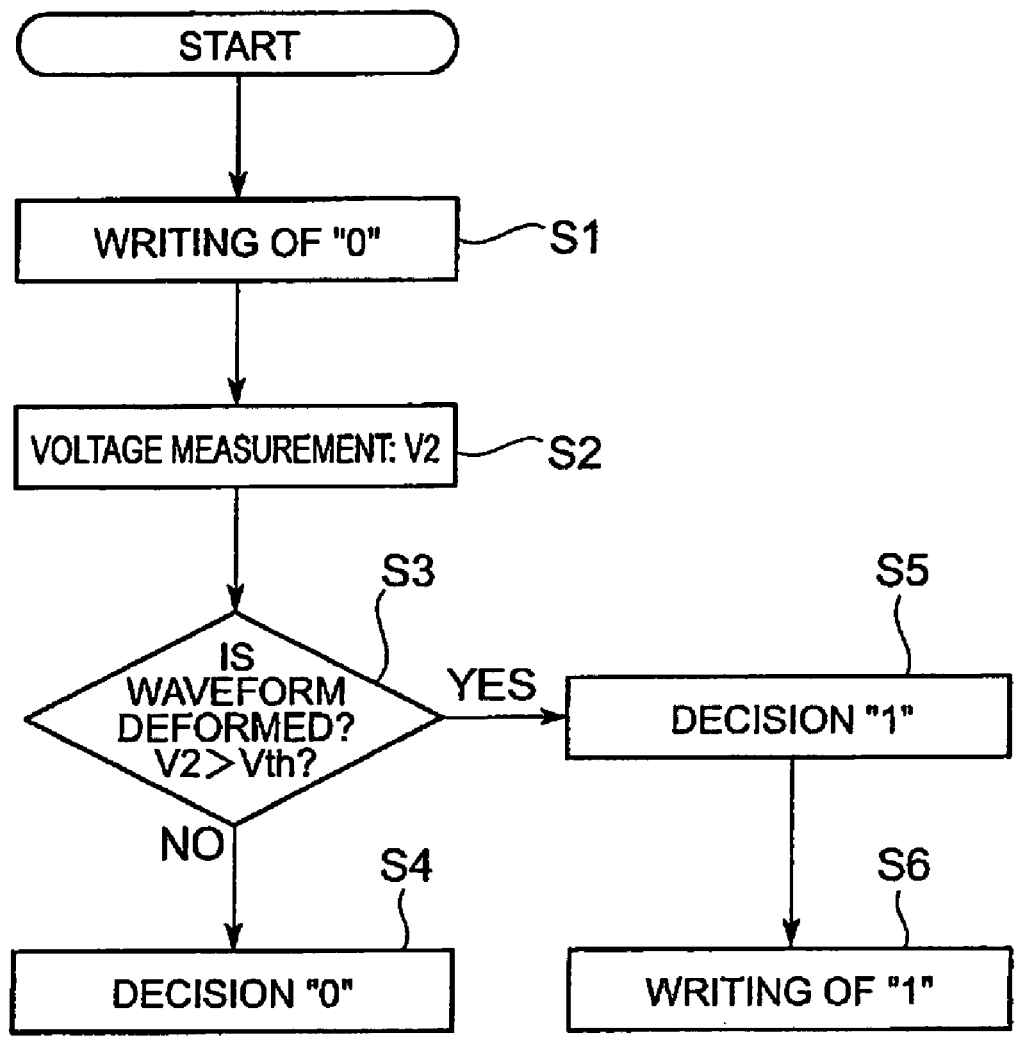
FIG. 2 is a flowchart for explaining an operation of the readout circuit.

FIG. 2 is a flowchart for explaining the operation of the above-described readout circuit.

First, the writing control circuit 1 intentionally writes the first data (=0) in the magnetoresistive element MR (S1) and the determination circuit 5 measures the voltage V2 upon this writing (S2). Subsequently, the determination circuit 5 determines whether the waveform of the voltage V2 is deformed from the normal waveform, or, in other words, whether the voltage V2 is larger than the reference potential Vth (S3). When the result of the determination is "No," i.e., when the preliminarily stored value agrees with the writing data (first data="0") to indicate the first waveform, the result of the determination by the determination circuit 5 is the first data "0." Namely, the stored data is found to be "0" (S4).

On the other hand, when the determination circuit 5 determines whether the waveform of the voltage V2 is deformed from the normal waveform, or, in other words, whether the voltage V2 is larger than the reference potential Vth (S3), and when the result of the determination is "Yes," i.e., when the preliminarily stored value is different from the writing value (first data "0") to indicate the second waveform, the result of the determination by the determination circuit 5 is the second data "1." Namely, the stored data is found to be "1" (S5). Since the writing control circuit 1 has written "0" herein, the writing control circuit 1 writes the original data "1" in the magnetoresistive element MR as a source of the data (S6).

The above-described technique achieves accurate data readout from each element because the determination is carried out on the basis of the output waveform upon rewriting of stored data of its own even if the characteristics of the magnetoresistive elements MR slightly differ among the elements. Since the stored data is read out while being broken by the writing, there is no effect on the determination of data read out even if the write current in the readout (read current) is set so large as to cause magnetization switching. It has been considered heretofore that the read current needed to be not more than 1/10 of the write current, but the above-described configuration lifts the restrictions on the magnitude of the read current.

Such writing of data can be implemented by spin-injection magnetization switching.

Figure 3:
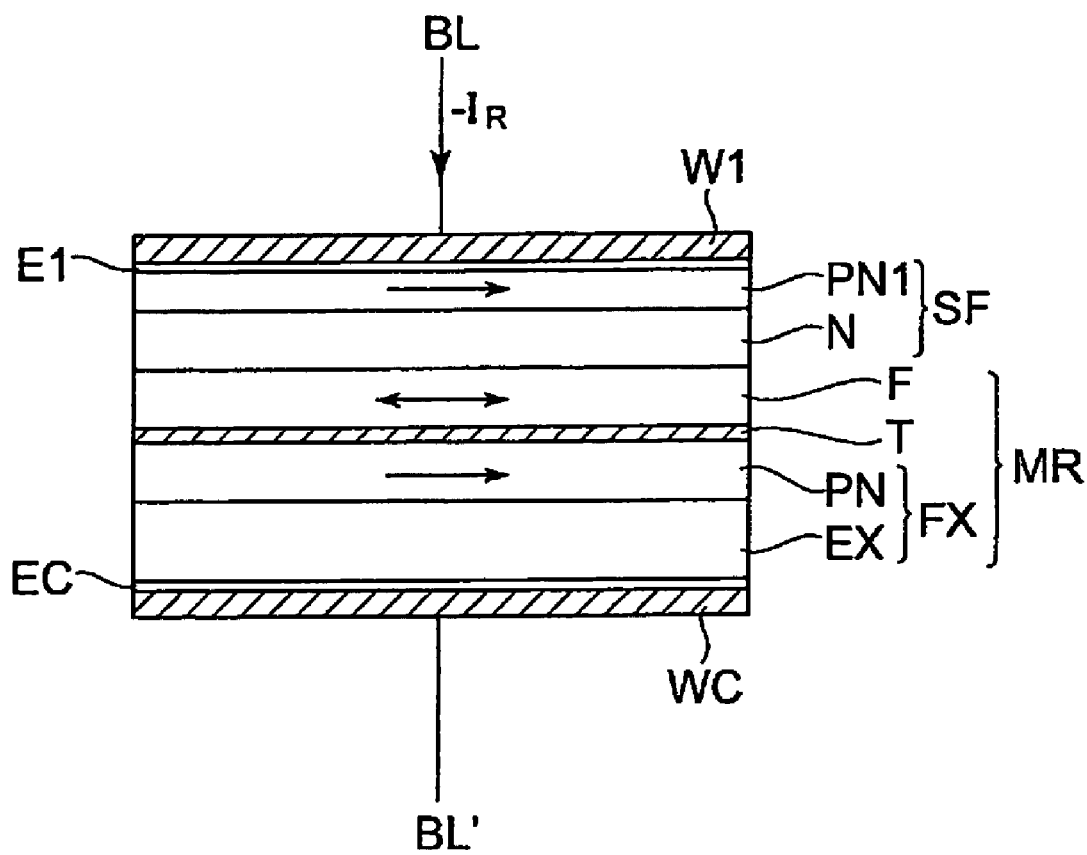
FIG. 3 is a vertical sectional view of a storage element including a magnetoresistive element MR.

FIG. 3 is a vertical sectional view of a storage element including a magnetoresistive element MR.

An individual storage region P(X,Y) is comprised of a first wire W1 (bit line BL) for supply of write current $I_W$ (=read current $I_R$), a common wire WC (reference line BL'), a magnetoresistive element MR, and a spin filter SF given to the magnetoresistive element MR.

The magnetoresistive element MR is a TMR element having an insulating layer T between a magnetosensitive layer F and a fixed or pinned layer FX. The TMR element is an element making use of a phenomenon in which a ratio of electrons passing the insulating layer T as a tunnel barrier layer during readout of information varies according to a difference between the orientation of magnetization in the magnetosensitive layer F stored and the orientation of magnetization in the fixed layer FX (PN), and is able to perform highly sensitive detection of stored information. The orientation of magnetization in the fixed layer FX (PN) is fixed by an antiferromagnetic layer EX exchange-coupled therewith.

The spin filter SF has a nonmagnetic electroconductive layer N provided on the magnetoresistive element MR, and a first fixed layer PN1 consisting of a ferromagnet in contact with the nonmagnetic electroconductive layer N, and has a function of transmitting or reflecting electrons with a spin of a specific polarity and accumulating electrons with the spin of this polarity in the magnetosensitive layer F of the magnetoresistive element MR. When an amount of spins accumulated exceeds a magnetization switching threshold of the magnetosensitive layer F, magnetization switching occurs. A first electrode layer E1 is interposed between the spin filter SF and the first wire W1, and a common electrode layer EC is interposed between the antiferromagnetic layer EX and the common wire WC.

The first wire W2 is connected to the bit line BL, and the common wire WC is connected through a transistor for switching Q to the reference potential.

The memory information "1" or "0" is defined according to a state of orientations of magnetizations in the ferromagnetic layer (fixed layer) PN and the magnetosensitive layer F forming the TMR element, i.e., depending upon whether the directions of magnetizations are parallel or antiparallel. When the orientations of magnetizations in the ferromagnetic layer PN and in the magnetosensitive layer F are antiparallel, the value of electric resistance R in the thickness direction is larger than when the orientations of the magnetizations are parallel. In other words, the resistance R in the parallel case is not more than a threshold $R_0$, while the resistance R in the antiparallel case is larger than the threshold $R_0$. Therefore, the information "1" or "0" is read out by applying the read current in the thickness direction of the TMR element and measuring a resistance value or current value of the TMR element by the MR (magnetoresistance) effect. For example, the parallel state of low resistance is defined as "0," and the antiparallel state of high resistance as "1." In the foregoing example, the resistance is indirectly measured by voltage.

The data writing means applies the write current flowing in the first direction to the magnetoresistive element MR in writing of the first data, and applies the write current flowing in the direction opposite to the first direction, in writing of the second data. In the data writing making use of the spin-injection magnetization switching, the state of data stored can be varied by switching the direction of flow of the electric currents. For example, when the write current is allowed to flow in the first direction, "0" is written; when the write current is allowed to flow in the opposite direction, "1" is written.

Constituent materials of the above-described elements are as follows.

A material of the magnetosensitive layer F can be selected, for example, from ferromagnetic materials such as Co, CoFe, NiFe, NiFeCo, CoPt, and CoFeB. The magnetosensitive layer F can change its magnetization direction as assisted by the electric current flowing in the first wire W1 and a magnetic field around the electric current, and the smaller the area of the magnetosensitive layer F, the smaller the electric current (threshold of electric current) is necessary for magnetization switching. The orientation of magnetization in the magnetosensitive layer F is, for example, parallel to the Y-axis direction.

A material of the nonmagnetic insulating layer T can be selected from oxides or nitrides of metals such as Al, Zn, and Mg and is preferably, for example, $Al_2O_3$ or MgO. A structure applicable for the fixed layer FX is the exchange coupling type in which an antiferromagnetic layer is given to a ferromagnetic layer, and the orientation of magnetization in the ferromagnetic layer PN is fixed in the +Y-direction. A material of the ferromagnetic layer PN can be selected from those described above. A material of the antiferromagnetic layer EX can be selected from materials such as IrMn, PtMn, FeMn, NiMn, PtPdMn, RuMn, and NiO, or materials of arbitrary combinations thereof. A material of the nonmagnetic electroconductive layer N and the electrode layers E1, EC can be Cu or Ru. A variety of wiring materials applicable include Cu, AuCu, W, Al, and so on. A material of the fixed layer PN1 can be selected from the aforementioned ferromagnetic materials and the orientation of magnetization thereof is fixed in the −Y-direction.

Figure 4A:
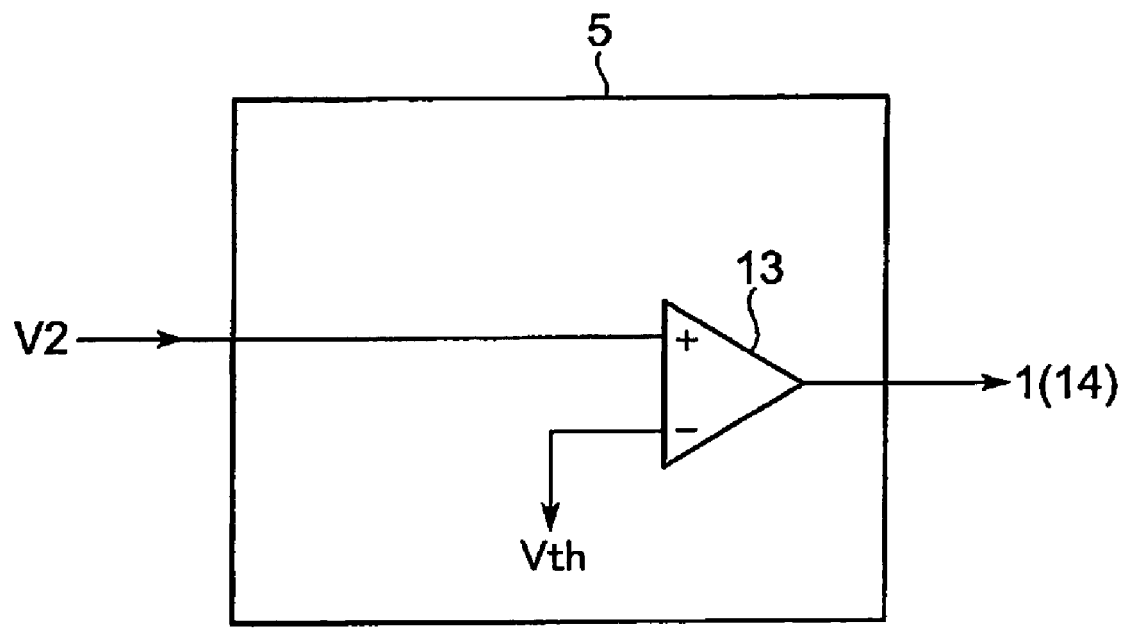
FIG. 4A is a circuit diagram showing an example of determination circuit 5.
Figure 4B:
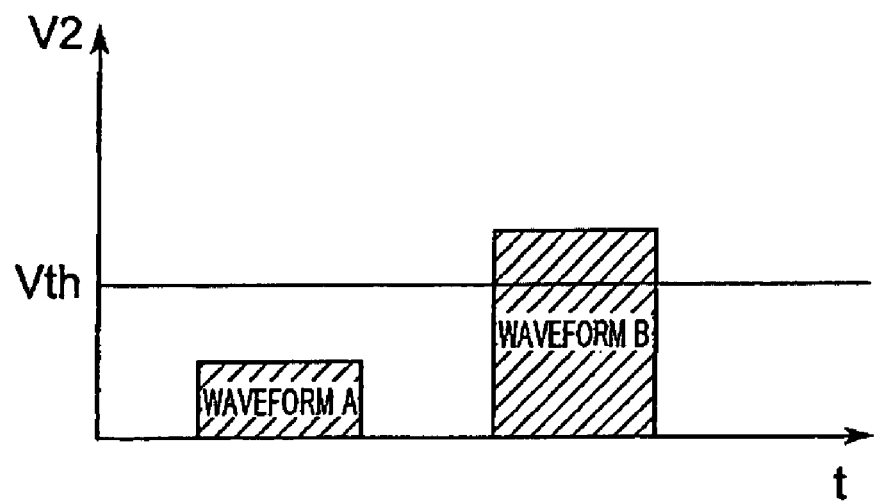
FIG. 4B is a graph of voltage V2 versus time t.

FIG. 4A is a circuit diagram showing an example of determination circuit 5 and FIG. 4B a graph of voltage V2 versus time t.

The determination circuit 5 comprises a comparator 13 two input terminals of which are connected to the magnetoresistive element MR and to the reference potential Vth, respectively. When the output V2 from the magnetoresistive element MR is not more than the reference potential Vth, the output from the comparator 13 is L-level, e.g., output of "0," and it can be determined that the first waveform (waveform A) is outputted (cf. FIG. 4B). When the output V2 from the magnetoresistive element MR exceeds the reference potential Vth, the output from the comparator is H-level, e.g., output of "1," and it can be determined that the second waveform (waveform B) is outputted (cf FIG. 4B).

A specific example of the readout circuit will be described below.

Figure 5:
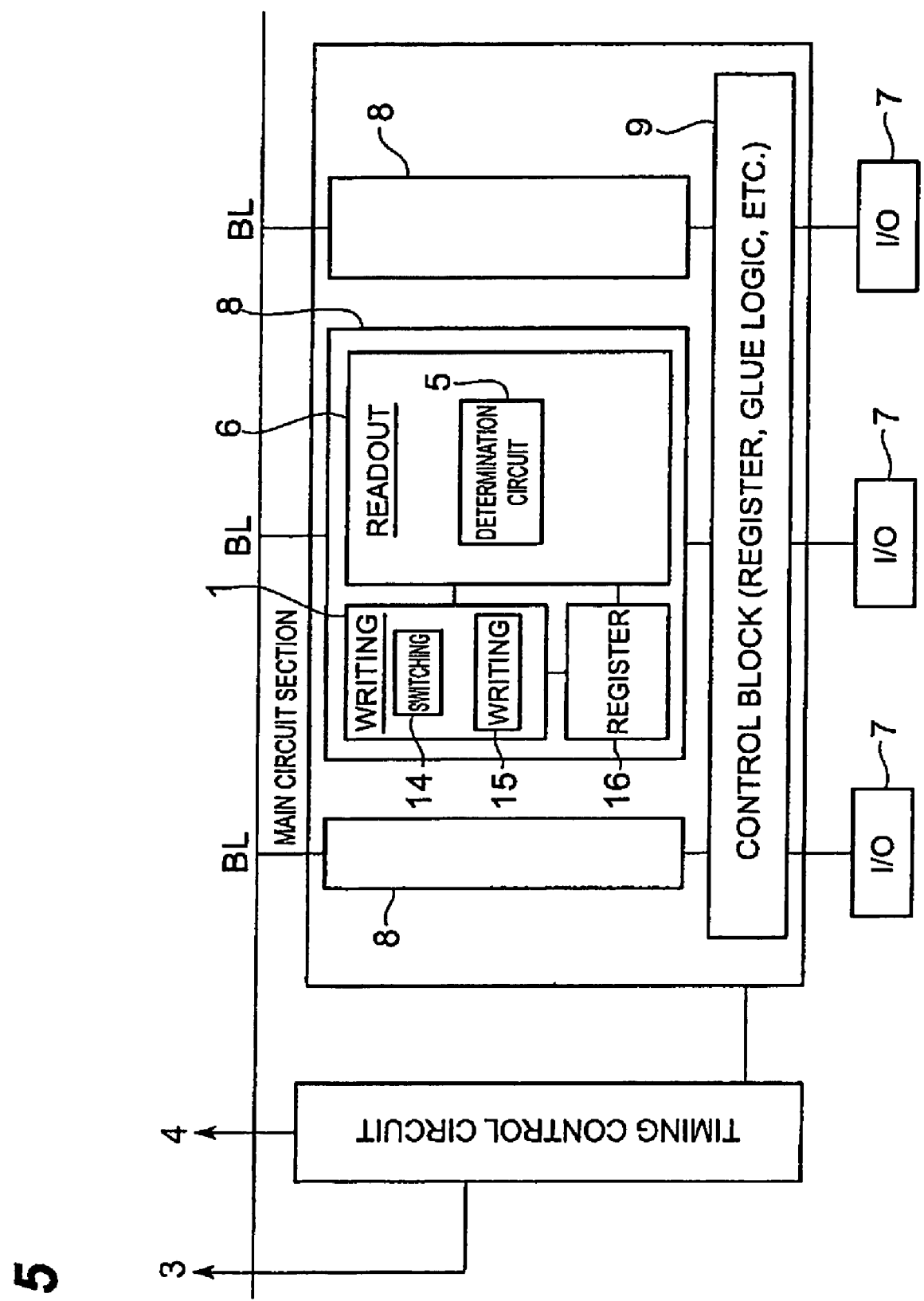
FIG. 5 is a block diagram of a magnetic memory having a readout circuit.

FIG. 5 is a block diagram of a magnetic memory having a readout circuit.

A control circuit 8 is connected to each bit line BL and a main circuit section is composed of a plurality of control circuits 8. A control circuit 8 includes a readout control circuit 6 and a writing control circuit 1. A control block 9 includes a register, a glue logic, etc. and creates a readout command and writing information of data of storage region P(X,Y) with address (X,Y), based on information fed through the input/output circuit 7.

The readout control circuit 6 has the aforementioned determination circuit 5. The writing control circuit 1 has a switching controller 14 for outputting the writing command of "0" or "1" in synchronization with the address designation and according to an output from the determination circuit 5, and a write current controller 15 for supplying a write current to each bit line BL. The writing information and various setting information fed to the writing control circuit 1 can be stored in the register 16.

Figure 6:
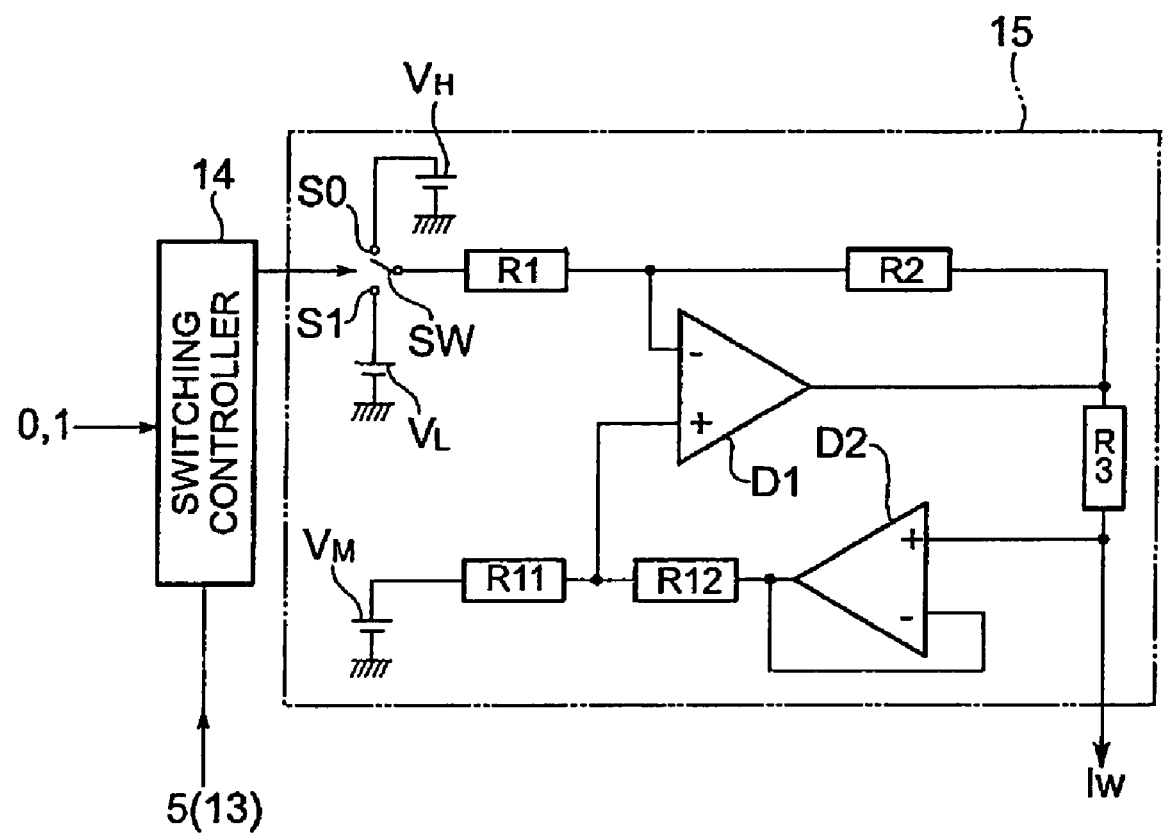
FIG. 6 is a circuit diagram of switching controller 14 and write current controller 15 to which an output from comparator 13 is fed.

FIG. 6 is a circuit diagram of the switching controller 14 and the write current controller 15 to which the output from the comparator 13 is fed.

The writing current controller 15 is constructed by connecting resistors R1, R2, R11, R12, R3, and operational amplifiers D1, D2 as illustrated. The resistor R11 is connected to an arbitrary constant value $V_M$. In normal writing control, when receiving a write command of "0" or "1," the switching controller 14 switches a switch SW in synchronization with the address designation to control the direction of the write current $I_W$ flowing in the bit line BL. The switch SW is connected to two terminals (S0, S1) having respective fixed potentials whereby the electric current flows in the direction opposite to the first direction to write "1" in the magnetoresistive element MR.

When the output from the determination circuit 5 (comparator 13) is fed to the switching controller 14, and when the determination result indicates the second waveform, i.e., in the case of "H" (=1), the switch SW is connected to the terminal S1 to apply the electric current in the direction opposite to the first direction, to write "1" in the magnetoresistive element MR at a corresponding address. When the determination result indicates the first waveform, i.e., in the case of "L" (=0), the switch SW is kept open to do nothing, or the switch SW is connected to the terminal S0 to apply the electric current in the first direction, to write "0" in the magnetoresistive element MR. This circuit can also be applied to an electric current supply circuit for readout.

As described above, the foregoing magnetic memory adopts the method of identifying the state of each element at the same time as the writing, requires no special readout current, and determines the output V2 of its own, and therefore variation is reduced among the elements. Since the readout operation is carried out at the same time as the writing of known data, it becomes possible to implement writing, reset, etc. at the same time of reading. As described above, the readout circuit of the magnetic memory achieves accurate data readout from each element because the determination is carried out on the basis of the stored data of its own even if the characteristics of the magnetoresistive elements MR slightly differ among the elements. In addition, it requires no reference cell, and thus achieves simplification of the circuit layout and improvement in integration degree.

A readout circuit of a magnetic memory according to the second embodiment will be described below.

Figure 7:
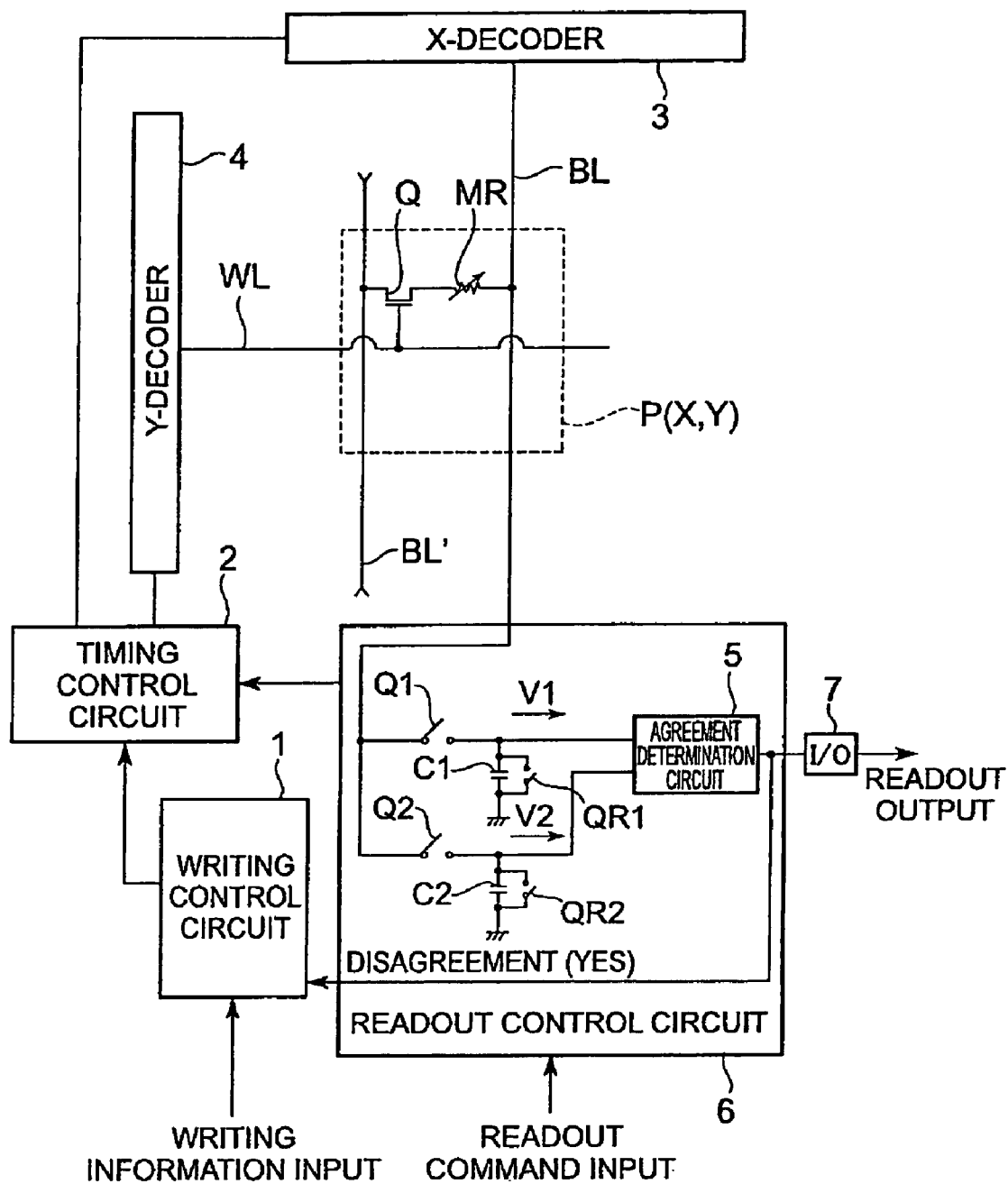
FIG. 7 is a block diagram of a magnetic memory having a readout circuit.

FIG. 7 is a block diagram of the magnetic memory having the readout circuit. The storage section of the magnetic memory consists of an array of storage regions P(X,Y) in X columns and Y rows, and each storage region P(X,Y) has a magnetoresistive element MR.

One magnetoresistive element MR has a magnetosensitive layer capable of spin-injection magnetization switching, in which magnetization switching is induced according to a direction and magnitude of an injected electric current to change the resistance.

Each of bit lines extending along the Y-axis from X-decoder 3 is connected to one ends of the magnetoresistive elements MR, and the other ends of the magnetoresistive elements MR are connected through a transistor Q for switching to a reference line BL'. A gate of each transistor Q is connected to a word line WL extending along the X-axis from Y-decoder 4.

When writing information indicating an address of a storage region P(X,Y) and writing data is fed to writing control circuit 1, the writing control circuit 1 drives timing control circuit 2 to control the X-decoder 3 and Y-decoder 4 as described below, so as to write the data in the storage region P(X,Y).

In a state in which a potential of a bit line BL is kept higher than a potential of the reference line BL' (i.e., in a state of the potential of the bit line BL=$V_H$'), a potential of the word line WL is set to a specific level and the transistor for switching Q is turned on, whereupon a write current $I_W$ flows from the bit line BL into the magnetoresistive element MR to inject a spin of a specific polarity into the magnetosensitive layer, thereby writing "0," for example. In a state in which the potential of the bit line BL is kept lower than the reference potential (i.e., in a state of the potential of the bit line BL=$V_L$'), the potential of the word line WL is set to a specific level and the transistor for switching Q is turned on, whereupon a write current (−) $I_W$ flows from the bit line BL into the magnetoresistive element MR, to inject a spin of the polarity opposite to that in the above, thereby writing "1," for example. During the writing, the potential of the reference line BL' is set, for example, at an arbitrary constant value $V_M$.

When a readout command indicating an address of storage region P(X,Y) is fed to the readout control circuit 6, the readout control circuit 6 drives the timing control circuit 2 to control the X-decoder 3 and Y-decoder 4 as described below, so as to read out the data in the storage region P(X,Y).

In a first period, the potential of the bit line BL is set slightly lower than the potential of the reference line BL' (the potential of the bit line BL=$V_L$"), and in a state in which a switch Q1 to connect the bit line BL and a capacitor C1 is turned on, the potential of the word line WL is set to a specific level to turn on the transistor for switching Q, whereupon the read current (−) $I_R$ (electric current in such a magnitude as not to induce spin-injection magnetization switching) flows from the reference line BL' into the magnetoresistive element MR to generate a voltage V1 between two ends of the capacitor C1. The magnitude of this voltage V1 corresponds to the resistance of the magnetoresistive element MR.

After the data (V1) is temporarily stored in the capacitor (first storing means) C1, the switch Q1 is turned off and then the reference potential of the reference line BL' is set, for example, to an arbitrary constant value $V_M$. In a state in which the potential of the bit line BL is set higher than the reference potential (the potential of the bit line=$V_H$'), the potential of the word line WL is set to a specific level to turn on the transistor for switching Q, whereupon a write current (+) $I_W$ flows from the bit line BL into the magnetoresistive element MR, to write, for example, "0" by the aforementioned spin-injection magnetization switching.

In a second period, after writing of "0," the potential of the bit line BL is set slightly lower than the potential of the reference line BL' (the potential of the bit line=$V_L$"), and in a state in which a switch Q2 to connect the bit line BL and a capacitor C2 is turned on, the potential of the word line WL is set to a specific level to turn on the transistor for switching Q, whereupon the read current (−) $I_R$ (electric current in such magnitude as not to induce spin-injection magnetization switching) flows from the bit line BL into the magnetoresistive element MR, to generate a voltage V2 between two ends of the capacitor C2. The magnitude of this voltage V2 corresponds to the resistance of the magnetoresistive element MR. The data (V2) is temporarily stored in the capacitor (second storing means) C2.

The voltages V1 and V2 corresponding to the resistance of the magnetoresistive element MR (output values) are fed to an agreement determination circuit 5. When the two input values agree with each other, the agreement determination circuit 5 outputs a logical level "L" (=0); when they do not agree, the agreement determination circuit 5 outputs a logical level "H" (=1). Namely, when the initial voltage V1 agrees with the voltage V2 stored by intentionally writing "0," "0" is outputted; when they do not agree, "1" is outputted. This output is exactly the data originally stored in the magnetoresistive element MR.

The readout circuit further comprises an input/output circuit (input/output means) 7 for outputting the result of the determination by the agreement determination circuit 5, by a logical level as readout information to the outside. The input/output circuit 7 outputs the logical level indicating the result of the determination by the agreement determination circuit 5, to the outside.

When the output from the agreement determination circuit 5 indicates disagreement, the intentional writing of "0" is wrong, and thus the agreement determination circuit 5 controls the writing control circuit 1 to rewrite the data in the magnetoresistive element MR into "1." A method of the writing is as described above.

After completion of the readout from one magnetoresistive element, the two ends of the capacitors C1, C2 are short-circuited by reset switches QR1, QR2 to reset the voltages stored in the capacitors C1, C2.

It is noted that the aforementioned "agreement" does not have to be perfect agreement but may be agreement with some error. The error is preferably not more than 10%. In this case, a determination of "agreement" can be made when the difference between the first and second output values (V1, V2) is not more than a preset value.

As described above, the foregoing circuit comprises the capacitor (first storing means) C1 for temporarily storing the first output value (V1) of the magnetoresistive element MR in the first period, the capacitor (second storing means) C2 for temporarily storing the second output value (V2) of the magnetoresistive element MR in the second period after the first period, the agreement determination circuit (determining means) 5 for making a determination on agreement between the first and second output values (V1, V2) stored in the first and second capacitors C1, C2, and the data writing means (writing control circuit 1, timing control circuit 2, X-decoder 3, and Y-decoder 4) for writing the first data (=0) in the magnetoresistive element MR at a time between the first and second periods and for, when the result of the determination by the agreement determination circuit 5 indicates disagreement after the second period, inducing spin-injection magnetization switching in the magnetosensitive layer to write the second data (=1) different from the first data (=0) in the magnetoresistive element MR.

Figure 8:
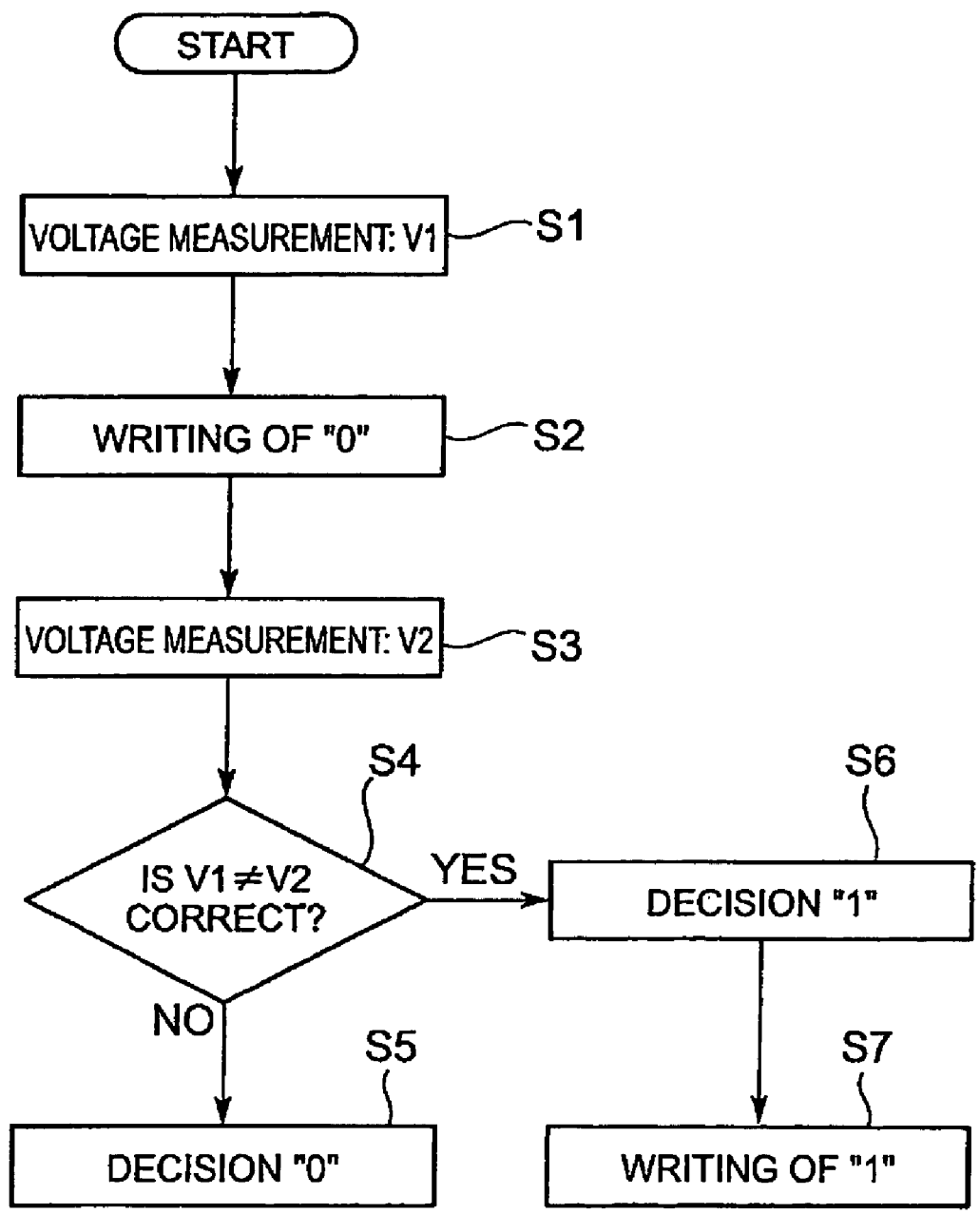
FIG. 8 is a flowchart for explaining an operation of the readout circuit.

FIG. 8 is a flowchart for explaining the operation of the above-described readout circuit.

In the first step, the capacitor C1 stores the value preliminarily stored in the magnetoresistive element MR, as the first output value (V1) in the first period (S1). In the next step, the data writing means intentionally writes the first data (=0) in the magnetoresistive element MR (S2) and this value is again stored as the second output value (V2) into the capacitor C2 (S3). It is then determined whether the first and second output values (V1 and V2) disagree (S4). When the result of the determination is "No," i.e., when the preliminarily stored value agrees with the writing data (first data="0"), the first and second output values stored are equal to each other, and thus the result of the determination by the agreement determination circuit 5 is the first data "0." Namely, the stored data is found to be "0" (S5).

On the other hand, when a determination is made on disagreement between V1 and V2 (S4) and when the result of the determination is "Yes," i.e., when the preliminarily stored value disagrees with the writing data (first data="0"), the first and second output values (V1, V2) stored disagree, and the result of the determination by the agreement determination circuit 5 is the second data "1." Namely, the stored data is found to be data different from "0," i.e., "1" (S6). Since the data writing means has written "0" in this sequence, the data writing means writes the original data "1" into the magnetoresistive element MR as a source of the data (S7).

The above-described technique achieves accurate data readout from each element because the determination is carried out on the basis of the stored data of its own even if the characteristics of the magnetoresistive elements slightly differ among the elements.

The writing of data can be implemented by spin-injection magnetization switching.

The structure, material, and action of the magnetoresistive element MR are the same as those described on the basis of FIG. 3. An individual storage region P(X,Y) is comprised of a first wire W1 (bit line BL) for supply of write current IW and read current IR, a common wire WC (reference line BL'), a magnetoresistive element MR, and a spin filter SF given to the magnetoresistive element MR.

A specific example of the readout circuit will be described below.

Figure 9:
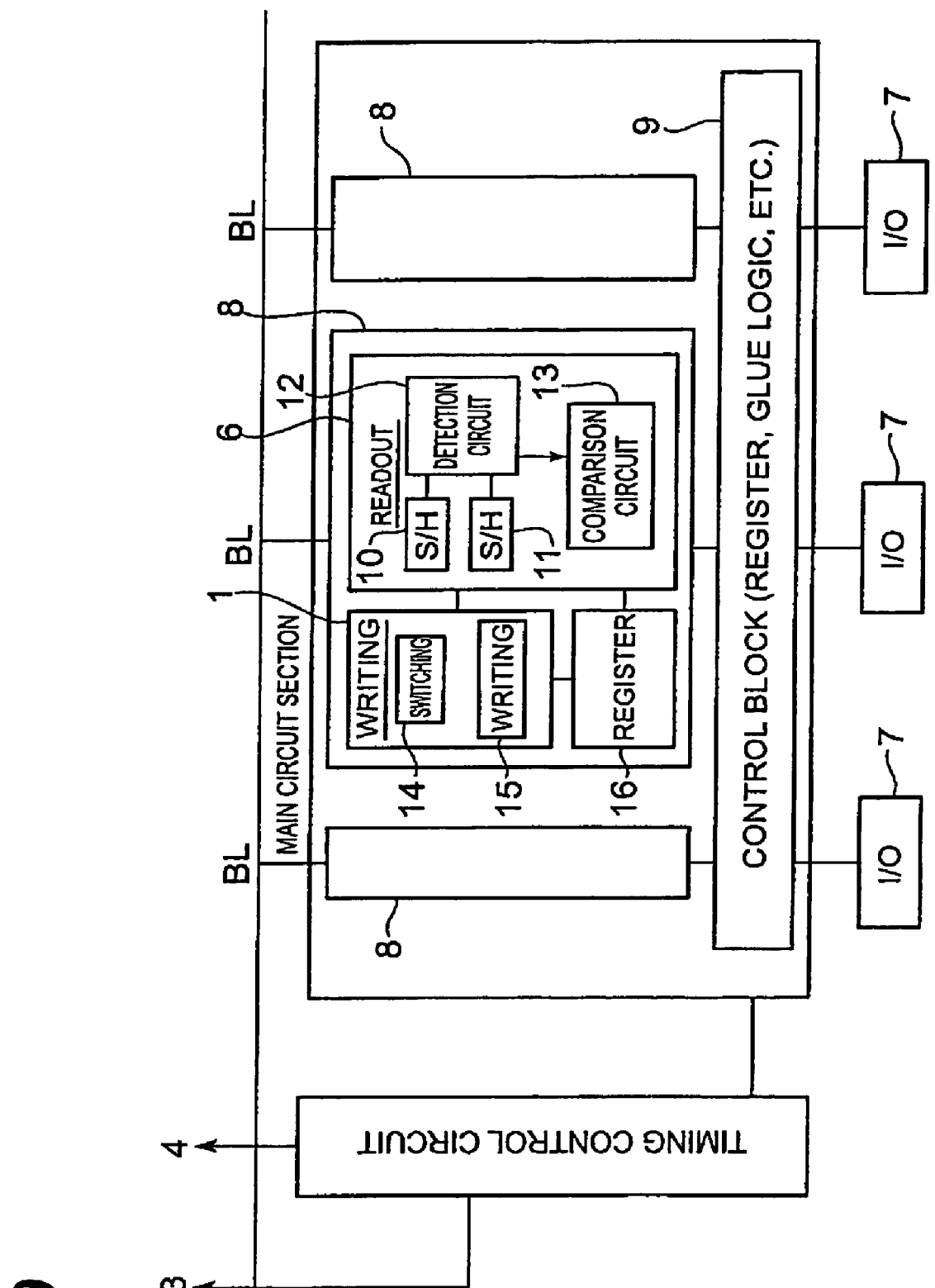
FIG. 9 is a block diagram of a magnetic memory having a readout circuit.

FIG. 9 is a block diagram of a magnetic memory having the readout circuit.

A control circuit 8 is connected to each bit line BL and a main circuit section is composed of a plurality of control circuits 8. A control circuit 8 includes a readout control circuit 6 and a writing control circuit 1. A control block 9 includes a register, a glue logic, etc. and creates a readout command and writing information of data of storage region P(X,Y) with address (X,Y), based on information fed through the input/output circuit 7.

The readout control circuit 6 has sample & hold circuits 10, 11 having functions similar to the aforementioned capacitors C1, C2, and detection circuit 12 and comparison circuit 13 constituting the aforementioned agreement determination circuit 5.

The writing control circuit 1 has a switching controller 14 for outputting a write command of "0" or "1" in synchronization with the address command and according to an output from the agreement determination circuit 5, and a write current controller 15 for supplying the write current to each bit line BL. The writing information and various setting information fed to the writing control circuit 1 can be stored in register 16.

Figure 10:
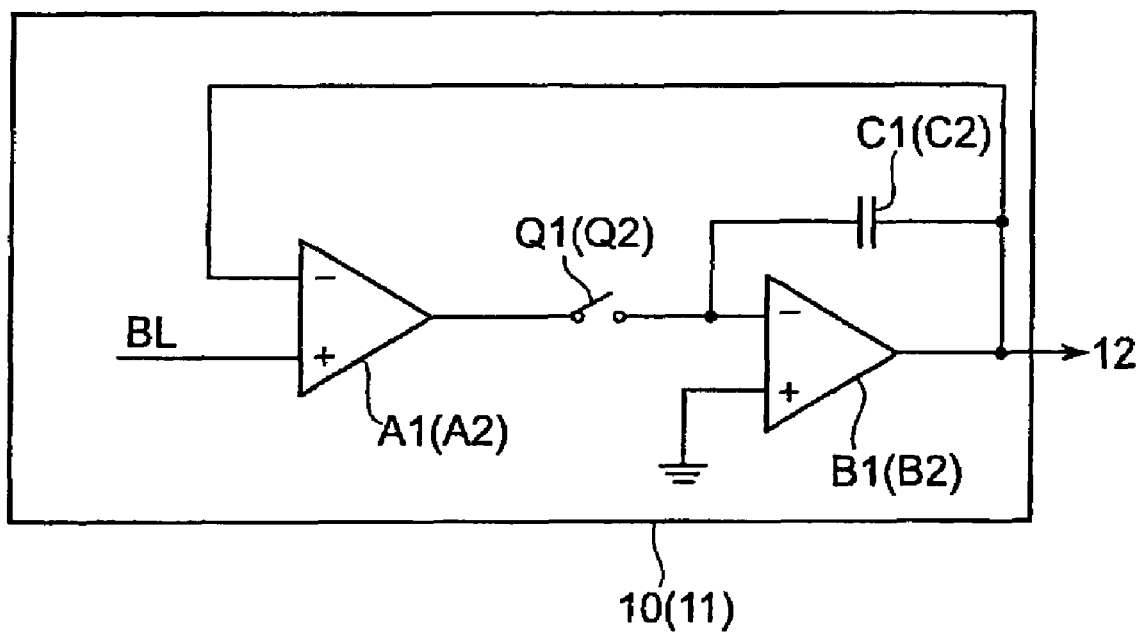
FIG. 10 is a circuit diagram of sample & hold circuit 10 (11).

FIG. 10 is a circuit diagram of sample & hold circuit 10 (11).

A bit line BL is connected to a noninverting input terminal of the first operational amplifier A1 (A2), and an output terminal of the first operational amplifier A1 (A2) is connected through switch Q1 (Q2) to an inverting input terminal of the second operational amplifier B1 (B2). An output terminal of the second operational amplifier B1 (B2) is connected to an inverting input terminal of the first operational amplifier A1 (A2) and a capacitor C1 (C2) is interposed between the output terminal and the inverting input terminal of the second operational amplifier B1 (B2).

When the switch Q1 (Q2) is turned on, a charge is accumulated according to the potential of the bit line BL in the capacitor C1 (C2); when the switch Q1 (Q2) is turned off, the accumulated charge is held and the voltage V1 (V2) according to the accumulated charge is outputted.

Figure 11:
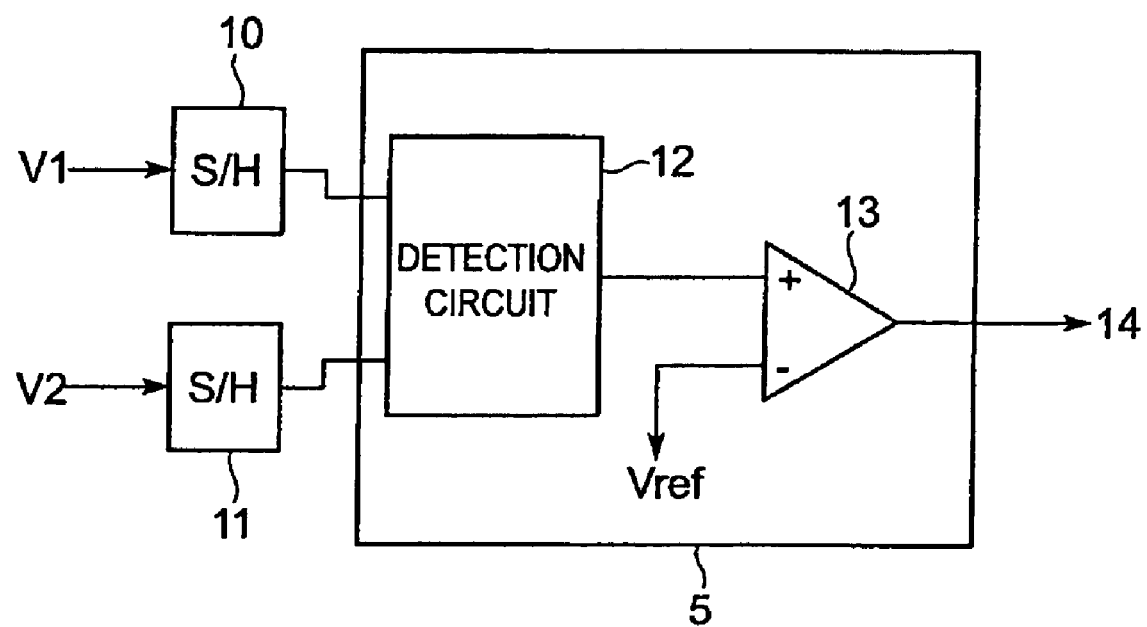
FIG. 11 is a circuit diagram of a readout control block including agreement determination circuit 5.

FIG. 11 is a circuit diagram of a readout control block including the agreement determination circuit 5. The agreement determination circuit 5 comprises a detection circuit 12 (difference means) for outputting a difference between the first and second output values V1, V2, and a comparison circuit 13 for outputting a signal "L" (=0) indicating agreement, when the output result from the detection circuit 12 is not more than a preset value Vref. When the output result from the detection circuit 12 is larger than the preset value Vref, the comparison circuit 13 outputs a signal "H" (=1) indicating disagreement.

In the present example, the structures and functions of the switching controller 14 and the write current controller 15 to which the output of the comparison circuit (comparator) 13 is fed are as shown in FIG. 6, and will be briefly described below.

The write current controller 15 is constructed by connecting resistors R1, R2, R11, R12, R3, and operational amplifiers D1, D2 as illustrated. The resistor R11 is connected to an arbitrary constant value $V_M$. In normal writing control, when receiving a write command of "0" or "1," the switching controller 14 switches the switch SW in synchronization with the address designation to control the direction of the write current $I_W$ flowing in the bit line BL. The switch SW is connected to two terminals (S0, S1) having respective fixed potentials $V_H$, $V_L$, and the potentials $V_H$, $V_L$ of these terminals satisfy the relation of $V_H > V_M > V_L$. Namely, the terminal S0 has the high potential $V_H$, while the terminal S1 has the low potential $V_L$. When the switch SW is connected to the terminal S0, the resistor R1 is connected to the high potential $V_H$, and the resistor R11 is connected to the middle potential $V_M$, whereby the electric current flows in the first direction to write "0" in the magnetoresistive element MR. When the switch SW is connected to the terminal S1, the resistor R11 is connected to the middle potential $V_M$ and the resistor R1 is connected to the low potential $V_L$, whereby the electric current flows in the direction opposite to the first direction to write "1" in the magnetoresistive element MR.

When the output of the agreement determination circuit 5 (comparison circuit 13) is fed to the switching controller 14, and when the determination result indicates disagreement, i.e., in the case of "H" (=1), the switch SW is connected to the terminal S1 to apply the electric current in the direction opposite to the first direction, to write "1" in the magnetoresistive element MR at a corresponding address. When the determination result indicates agreement, i.e., in the case of "L" (=0), the switch SW is kept open to do nothing, or is connected to the terminal S0 to apply the electric current in the first direction to write "0" in the magnetoresistive element MR. This circuit can also be used for supply of read current $I_R$ by setting the potential Vin smaller than the potential in the writing.

As described above, the readout circuit of the magnetic memory according to the present invention achieves accurate data readout from each element because the determination is carried out on the basis of the stored data of its own even if the characteristics of the magnetoresistive elements MR slightly differ among the elements. In addition, the readout circuit of the magnetic memory requires no reference cell and thus achieves simplification of the circuit layout and improvement in integration degree.

What is claimed is:

1. A readout circuit of a magnetic memory comprising:
    an array of magnetoresistive elements each having a magnetosensitive layer capable of spin-injection magnetization switching,
    the readout circuit comprising:
        data writing means for writing first data in the magnetoresistive element; and
        determining means for determining whether an output waveform from the magnetoresistive element upon writing of the first data by the data writing means is
            a first waveform outputted when the first data has previously been written in the magnetoresistive element, or
            a second waveform outputted when second data different from the first data has previously been written in the magnetoresistive element;
        wherein the determining means comprises:
            a comparator having two input terminals connected to the magnetoresistive element and to a reference potential, respectively, and
            wherein, when the comparator outputs a predetermined value indicating that the output waveform from the magnetoresistive element is the second waveform at the time of data writing by the data writing means, the data writing means induces spin-injection magnetization switching in the magnetoresistive layer to write the second data in the magnetoresistive element.

2. The readout circuit of the magnetic memory according to claim 1, wherein the data writing means is arranged as follows:
    in writing of the first data, the data writing means applies a write current flowing in a first direction, to the magnetoresistive element;
    in writing of the second data, the data writing means applies a write current flowing in a direction opposite to the first direction, to the magnetoresistive element.

3. The readout circuit of the magnetic memory according to claim 1, further comprising input/output means for outputting a result of determination by the determining means, by a logical level as readout information to the outside.

4. A readout circuit of a magnetic memory comprising:
    an array of magnetoresistive elements each having a magnetosensitive layer capable of spin-injection magnetization switching,
    the readout circuit comprising:
        first storing means for temporarily storing a first output value of the magnetoresistive element in a first period;
        second storing means for temporarily storing a second output value of the magnetoresistive element in a second period after the first period;
        determining means for making a determination on agreement between the first and second output values stored in the first and second storing means; and
        data writing means for writing first data in the magnetoresistive element at a time between the first and second periods,
    wherein the determining means comprises:
        difference means for outputting a difference between the first and second output values; and
        a comparison circuit for outputting a signal indicating agreement between the first and second output values after the second period, when an output result from the difference means is not more than a preset value,
    wherein, when the output signal from the comparison circuit indicates disagreement between the first and second output values after the second period, the data writing means induces spin-injection magnetization switching in the magnetoresistive layer to write second data different from the first data in the magnetoresistive element.

5. The readout circuit of the magnetic memory according to claim 4, wherein the data writing means is arranged as follows:
    in writing of the first data, the data writing means applies a write current flowing in a first direction, to the magnetoresistive element;
    in writing of the second data, the data writing means applies a write current flowing in a direction opposite to the first direction, to the magnetoresistive element.

6. The readout circuit of the magnetic memory according to claim 4, further comprising input/output means for outputting a result of the determination by the determining means, by a logical level as readout information to the outside.

7. A readout circuit for a magnetic memory with a magnetoresistive element having a magnetoresistive layer capable of spin-injection magnetization switching, said readout circuit comprising:
    data writing means for writing first data in the magnetoresistive element; and
    a comparator having two input terminals connected to the magnetoresistive element and to a reference potential, respectively,
    wherein, when the comparator outputs a predetermined value at the time of the data writing by the data writing means, and the predetermined value indicates the previously written data is changed by the writing of the first data, the data writing means induces spin-injection magnetization switching in the magnetoresistive layer to write second data in the magnetoresistive element.

8. A readout circuit according to claim 7, the predetermined value is H-level.

9. A readout circuit for a magnetic memory with a magnetoresistive element having a magnetosensitive layer capable of spin-injection magnetization switching, said readout circuit comprising:

a first capacitor for storing first data from the magnetoresistive element in a first period;

a second capacitor for storing second data from the magnetoresistive element in a second period;

data writing means for writing the first data in the magnetoresistive element at a middle period between the first and second periods;

difference means for outputting a difference between first and second output values respectively output from the first and second capacitor; and a comparison circuit for outputting a signal indicating agreement between the first and the second output values when an output result from the difference means is more than a preset value; and wherein, when the comparison circuit outputs a predetermined value indicating disagreement between the first and second output values when the output result from the difference means is more than the preset value, the data writing means induces spin-injection magnetization switching in the magnetosensitive layer to write the second data in the magnetoresistive element.

10. A readout circuit according to claim 9, wherein the predetermined value is H-level.

11. A readout circuit according to claim 9, wherein the agreement indicates an error not more than 10%.

* * * * *